United States Patent
Abdo

(10) Patent No.: US 11,374,537 B2
(45) Date of Patent: Jun. 28, 2022

(54) MAGNETIC FLUX BIAS FOR PULSE SHAPING OF MICROWAVE SIGNALS

(71) Applicant: International Business Machines Corporation, Armonk, NY (US)

(72) Inventor: Baleegh Abdo, Fishkill, NY (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 0 days.

(21) Appl. No.: 17/157,004

(22) Filed: Jan. 25, 2021

(65) Prior Publication Data

US 2021/0288611 A1 Sep. 16, 2021

Related U.S. Application Data

(63) Continuation of application No. 16/819,234, filed on Mar. 16, 2020, now Pat. No. 10,985,701.

(51) Int. Cl.
*H03D 7/00* (2006.01)

(52) U.S. Cl.
CPC ................. *H03D 7/005* (2013.01)

(58) Field of Classification Search
CPC .......... H03D 7/005; H03K 3/38; H03K 17/92; H03K 19/195; G11C 11/44; G01R 33/035; G01R 33/0352
See application file for complete search history.

(56) References Cited

U.S. PATENT DOCUMENTS

| | | | |
|---|---|---|---|
| 3,621,472 A | 11/1971 | Rothwarf | |
| 9,350,460 B2 | 5/2016 | Paik | |
| 9,697,473 B2 | 7/2017 | Abdo | |
| 9,843,312 B2 | 12/2017 | Abdo | |
| 9,858,532 B2 | 1/2018 | Abdo | |
| 10,211,798 B2 | 2/2019 | Abdo | |
| 10,262,276 B2 | 4/2019 | Puri | |
| 10,320,331 B1 | 6/2019 | Abdo | |
| 2004/0150398 A1 | 8/2004 | Champion et al. | |
| 2017/0373369 A1 | 12/2017 | Abdo et al. | |
| 2019/0049495 A1 | 2/2019 | Ofek | |
| 2019/0104614 A1 | 4/2019 | Abdo et al. | |
| 2019/0190474 A1 | 6/2019 | Abdo | |

FOREIGN PATENT DOCUMENTS

| | | |
|---|---|---|
| CN | 109327190 A | 2/2019 |
| EP | 3266063 A1 | 1/2018 |

OTHER PUBLICATIONS

"Realization or microwave amplification, attenuation, and frequency conversion using a single three-level superconducting quantum circuit" Yan-Jun Zhao, Jiang-Hao Ding, Z. H. Peng, Yu-Xi Liu Phys. Rev. A 95, 043806 (2017); arXiv:1510.05737v3 https://arxiv.org/abs/1510.05737.

(Continued)

*Primary Examiner* — Jung Kim
(74) *Attorney, Agent, or Firm* — Cantor Colburn LLP; Erik Johnson

(57) ABSTRACT

A technique relates to a pulse shaping of microwave signals. A nondegenerate mixing device receives signals and a time-varying magnetic flux via input ports. The nondegenerate mixing device uses the signals and the time-varying magnetic flux to generate an output signal on an output port, the output signal having a waveform profile set by the time-varying magnetic flux.

15 Claims, 14 Drawing Sheets

(56) References Cited

OTHER PUBLICATIONS

Abdo, B. et al., "Full Coherent Frequency Conversion between Two Propagating Microwave Modes," Physical Review Letters, vol. 110, No. 173902, Apr. 26, 2013, 5 pages.
Abdo, B. et al., "Josephson amplifier for qubit readout," Applied Physics Letters, vol. 99, No. 162506, Oct. 18, 2011, https://doi.org/10.1063/1.3653473, 4 pages.
Abdo, B. et al., "Nondegenerate three-wave mixing with the Josephson ring modulator," Physical Review B., vol. 87, No. 014508, Jan. 16, 2013, 18 pages.
Bergeal, N. et al., "Analog information processing at the quantum limit with a Josephson ring modulator," Nature Physics, Feb. 14, 2010, 7 pages.
Bergeal, N. et al., "Phase-preserving amplification near the quantum limit with a Josephson ring modulator," Nature, vol. 465, No. 6, May 2010, 6 pages.
Narla, A. et al., "Wireless Josephson amplifier," Applied Physics Letters, vol. 104, No. 232605, Jun. 12, 2014, 6 pages.
Roch, N. et al., "Widely Tunable, Nondegenerat3e Three-Wave Mixing Microwave Device Operating near the Quantum Limit," Physical Review Letters, vol. 108, No. 147701, Apr. 6, 2012, 5 pages.
Roy, T. et al., "Implementation of Pairwise Longitudinal Coupling in a Three-Qubit Superconducting Circuit," Physical Review Applied, vol. 7, No. 054025, May 30, 2017, 15 pages.
Schackert, F. et al., "Three-Wave Mixing with Three Incoming Waves: Signal-Idler Coherent Attenuation and Gain Enhancement in a Parametric Amplifier," Physical Review Letters, vol. 111, No. 073903, Aug. 16, 2013, 5 pages.
Sliwa, K.M. et al., "Reconfigurable Josephson Circulator/Directional Amplifier," Physical Review X, vol. 5, No. 041020, Nov. 5, 2015, 10 pages.
Supplementary Information for Bergeal, N. et al., "Phase-preserving amplification near the quantum limit with a Josephson ring modulator," www.nature.com/nature, doi: 10.1038/nature09035, 5 pages.
Zhao, Yan-Jun et al., "Realization of microwave amplification, attenuation, and frequency conversion using a single three-level superconducting quantum circuit," Tsinghua National Laboratory for Information Science and Technology (TNList), Beijing 10084, China, Dec. 1, 2016, 22 pages.
List of IBM Patents or Patent Applications Treated as Related; Date Filed: Jan. 25, 2021. 2 pages.
Abdo et al., "Magnetic Flux Bias for Pulse Shaping of Microwave Signals ," U.S. Appl. No. 16/819,234, filed Mar. 16, 2020.
Abdo et al. "Non-degenerate, three-wave mixing with the Josephson ring modulator"; Physical Review B, vol. 87, No. 1, Jan. 31, 2013.
International Search Report; International Application No. PCT EP2021/055527 ; International Filing Date: Mar. 4, 2021; dated Jun. 15, 2021; 13 pages.

DIFFERENTIAL MODE: "X" MODE

DIFFERENTIAL MODE: "Y" MODE

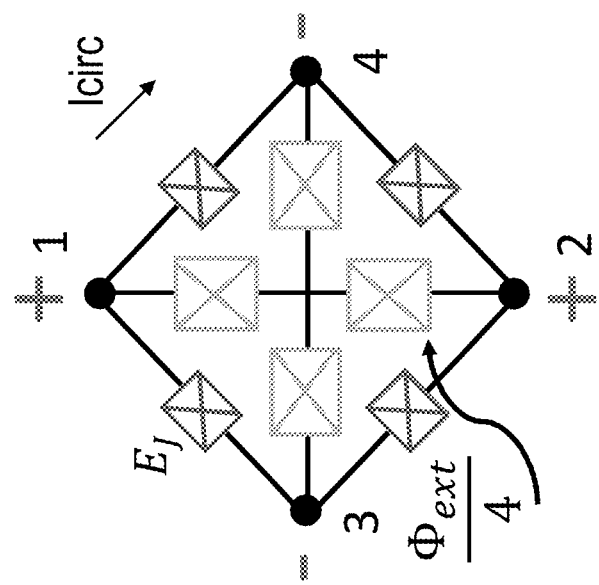

FIG. 11  1100

RECEIVE, BY A MIXING DEVICE, SIGNALS AND A TIME-VARYING MAGNETIC FLUX  1102

↓

USE, BY THE MIXING DEVICE, THE SIGNALS AND THE TIME-VARYING MAGNETIC FLUX TO GENERATE AN OUTPUT SIGNAL HAVING A WAVEFORM PROFILE SET BY THE TIME-VARYING MAGNETIC FLUX  1104

FIG. 12  1200

RECEIVE, BY A CIRCUIT, SIGNALS AND A TIME-VARYING MAGNETIC FLUX, THE CIRCUIT COMPRISING A FIRST MIXING DEVICE COUPLED TO A SECOND MIXING DEVICE  1202

↓

USE, BY THE CIRCUIT, THE SIGNALS AND THE TIME-VARYING MAGNETIC FLUX TO GENERATE AN OUTPUT SIGNAL HAVING A WAVEFORM PROFILE SET BY THE TIME-VARYING MAGNETIC FLUX  1204

FIG. 13 1300

```
COUPLE A MIXING DEVICE TO A MAGNETIC SOURCE, THE MIXING DEVICE BEING CONFIGURED TO
RECEIVE A TIME-VARYING MAGNETIC FLUX FROM THE MAGNETIC SOURCE  1302
```

```
CONFIGURE THE MIXING DEVICE TO GENERATE AN OUTPUT SIGNAL HAVING A WAVEFORM
PROFILE SET BY THE TIME-VARYING MAGNETIC FLUX  1304
```

FIG. 14 1400

```
COUPLE A FIRST MIXING DEVICE AND A SECOND MIXING DEVICE IN A CIRCUIT, THE FIRST MIXING
DEVICE BEING COUPLED TO A FIRST MAGNETIC SOURCE TO RECEIVE A FIXED MAGNETIC FLUX,
THE SECOND MIXING DEVICE BEING COUPLED TO A SECOND MAGNETIC SOURCE TO RECEIVE A
TIME-VARYING MAGNETIC FLUX  1402
```

```
CONFIGURE THE CIRCUIT TO GENERATE AN OUTPUT SIGNAL HAVING A WAVEFORM PROFILE
SET BY THE TIME-VARYING MAGNETIC FLUX  1404
```

MAGNETIC FLUX BIAS FOR PULSE SHAPING OF MICROWAVE SIGNALS

DOMESTIC PRIORITY

This application is a continuation of U.S. patent application Ser. No. 16/819,234, filed Mar. 16, 2020 which is now U.S. Pat. No. 10,985,701, the disclosure of which is incorporated by reference herein in its entirety.

BACKGROUND

The present invention generally relates to methods and structures for superconducting devices, and more specifically, to using magnetic flux bias for pulse shaping of microwave signals.

A characteristic of superconducting devices is that they can provide zero electrical resistance at sufficiently low temperatures. A dilution refrigerator or cryogenic device can be employed to cool superconducting devices to suitable temperatures for operation. In a known configuration, various input and output microwave lines at room temperature connect to the dilution refrigerator in order to provide microwave signals to superconductor devices, which are maintained at cooler temperatures inside the dilution refrigerator.

SUMMARY

Embodiments of the invention are directed to using magnetic flux bias for pulse shaping of microwave signals. A non-limiting example of a method includes receiving, by a nondegenerate mixing device, signals and a time-varying magnetic flux via input ports. The method includes using, by the nondegenerate mixing device, the signals and the time-varying magnetic flux to generate an output signal on an output port, the output signal having a waveform profile set by the time-varying magnetic flux.

A non-limiting example of a method includes receiving, by a circuit, signals and a time-varying magnetic flux via input ports, the circuit including a first nondegenerate mixing device coupled to a second nondegenerate mixing device. The method includes using, by the circuit, the signals and the time-varying magnetic flux to generate an output signal on an output port, the output signal having a waveform profile set by the time-varying magnetic flux.

A non-limiting example of a method of configuring a circuit includes coupling a nondegenerate mixing device to a magnetic source, the nondegenerate mixing device being configured to receive a time-varying magnetic flux from the magnetic source via an input port. The method includes configuring the nondegenerate mixing device to generate an output signal on an output port, the output signal having a waveform profile set by the time-varying magnetic flux.

A non-limiting example of a method of configuring a circuit includes coupling a first nondegenerate mixing device and a second nondegenerate mixing device in the circuit, the first nondegenerate mixing device being coupled to a first magnetic source to receive a fixed magnetic flux via an input port, the second nondegenerate mixing device being coupled to a second magnetic source to receive a time-varying magnetic flux via another input port. The method includes configuring the circuit to generate an output signal on an output port, the output signal having a waveform profile set by the time-varying magnetic flux.

A non-limiting example of a system includes a first magnetic source coupled to a first part of a circuit and configured to provide a fixed magnetic flux to the first part via an input port. The system includes a second magnetic source coupled to a second part of the circuit and configured to provide a time-varying magnetic flux to the second part via another input port, wherein the circuit is configured to generate an output signal on an output port, the output signal having a waveform profile set by the time-varying magnetic flux.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

FIG. 10C depicts a nondegenerate three-wave mixing device in common mode according to one or more embodiments of the invention;

FIG. 11 is a flow chart of a method for pulse shaping according one or more embodiments of the invention;

FIG. 12 is a flow chart of a method for pulse shaping according one or more embodiments of the invention;

FIG. 13 is a flow chart of a method for configuring a circuit according one or more embodiments of the invention; and FIG. 14 is a flow chart of a method for configuring a circuit according one or more embodiments of the invention.

The diagrams depicted herein are illustrative. There can be many variations to the diagrams or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the embodiments of the invention, the various elements illustrated in the figures are provided with two or three digit reference numbers. With minor exceptions, the leftmost digit(s) of each reference number correspond to the figure in which its element is first illustrated.

DETAILED DESCRIPTION

One or more embodiments of the invention provide techniques and devices for performing pulse shaping of continuous wave microwave signals inside a cooling system. In some embodiments of the invention, the cooling system includes a dilution refrigerator. One or more embodiments of the invention perform pulse shaping of microwave signals in close proximity to a quantum device. In some embodiments of the invention, the quantum processor that is in close proximity to the pulse shaping microwave signals is inside the cooling system. Because generating microwave signals using room-temperature electronics and transmitting these signals through microwave lines to a superconductor device can result in various degradation issues, one or more embodiments of the invention can avoid such degradation issues associated with transmitting microwave signals from room temperature to the base stage temperature of the dilution refrigerator because pulse shaping of microwave signals occurs inside the cooling system in proximity to the one or more quantum devices.

Figure 1:
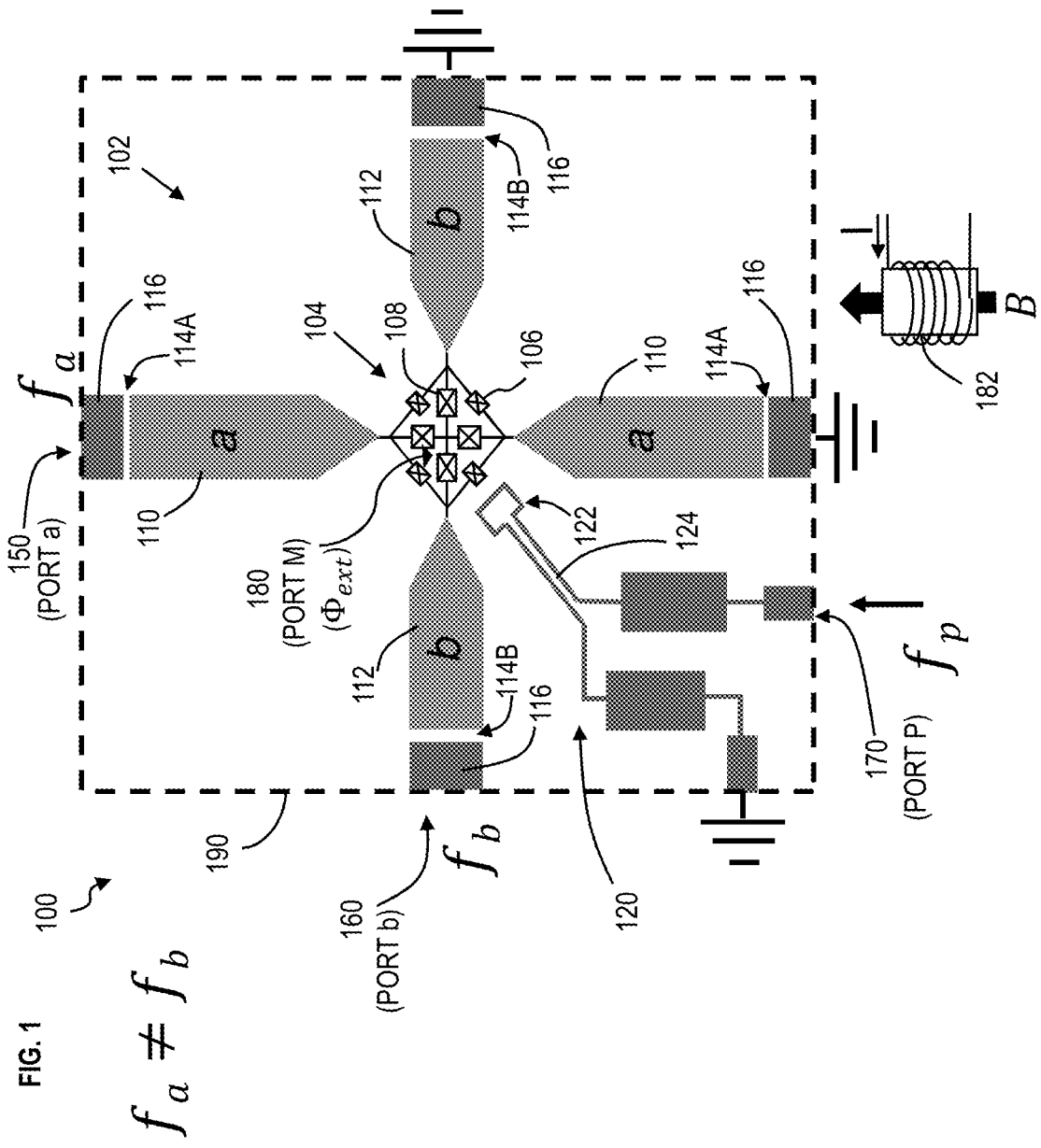
FIG. 1 depicts a schematic of a circuit according to one or more embodiments of the invention.

Turning now to a more detailed description of aspects of the present invention, FIG. 1 depicts a schematic of a circuit 100 for a nondegenerate parametric device 102 according to one or more embodiments of the invention. The nondegenerate parametric device 102 is illustrated as an example Josephson parametric converter (JPC). The nondegenerate parametric device 102 is structured to amplify and/or mix microwave signals at the quantum limit. The nondegenerate parametric device 102 includes a Josephson ring modulator (e.g., JRM) 104 that is incorporated into two microwave resonators 110 (e.g., resonator a) and 112 (e.g., resonator b) at an rf-current (i.e., radio frequency current) anti-node of their fundamental eigenmodes. The JRM 104 is a nonlinear dispersive element which includes Josephson tunnel junctions 106 that can perform three-wave mixing of microwave signals at the quantum limit. The JRM 104 has four nominally identical Josephson junctions 106 arranged in a Wheatstone bridge configuration with four nodes. Performance of JRM 104, namely power gain, dynamical bandwidth, and dynamic range are strongly dependent on the critical current of the Josephson junctions 106 of the JRM 104, the specific realization of the electromagnetic environment (i.e., the microwave resonators 110 and 112), and the coupling between the JRM 104 and the resonators 110 and 112.

As depicted in FIG. 1, one end of resonator 110 (e.g., resonator a) couples to port 150 (e.g., port a) via a coupling capacitor 114A and transmission line 116, while the other end of resonator 110 couples to ground via coupling capacitor 114A and transmission line 116. One end of resonator 112 (e.g., resonator b) couples to port 160 (e.g., port b) via coupling capacitor 114B and transmission line 116, while the other end of resonator 112 couples to ground via coupling capacitor 114B and transmission line 116. The resonator 110 has a resonance frequency $f_a$ and resonator 112 has a resonance frequency $f_b$, where $f_a$ does not equal $f_b$. A pump port 170 (e.g., port P) couples to the JRM 104 via flux line 120. The flux line 120 can include a short-circuited loop 122 that capacitively couples to the JRM 104, thereby forming a short-circuited coplanar stripline. The flux line 120 can be a lossless on-chip flux line capacitively coupled to two adjacent nodes of the four nodes of the JRM 104. The pump port 170 receives a pump microwave signal (e.g., pump drive) at frequency $f_p$ that couples differentially to the two adjacent nodes of the JRM 104, where the pump drive signal excites a common mode of the nondegenerate parametric device 102 (e.g., JPC).

A controlled magnetic source 182 provides an external flux bias to the JRM 104 by generating a magnetic field (e.g., B field, or magnetic flux density) based on current (I). Port 180 (e.g., port M) is illustrated as an example of the JRM 104 receiving the extremal flux. The example location of port 180 is provided for illustrative purposes and is not meant to be limited. In accordance with one or more embodiments of the invention, the magnetic source 182 is configured to generate and provide a time-varying magnetic flux or pulsed magnetic flux to the JRM 104. The applied magnetic field is varied (e.g., by applying current (e.g., direct or alternating current) to a superconducting coil), which, in turn, translates into the applied magnetic flux. The magnetic flux ($\Phi_{ext}$) is a physical quantity which represents the amount of the magnetic field threading the superconducting loop (i.e., JRM 104). It should be appreciated that although FIG. 1 illustrates that the magnetic source 182 is external to chip 190, the magnetic source 182 can be implemented in other ways and can be on-chip in one or more embodiments of the invention. In some examples, the external magnetic flux can be applied using an on-chip flux line, external magnetic coil (e.g., magnetic source 182), and/or using magnetic material integrated on-chip or in the chip package.

It is contemplated that although FIG. 1 depicts a microstrip implementation of the nondegenerate parametric device 102 as a JPC on chip 190, the nondegenerate parametric device 102 is not meant to be limited and other implementations are possible. The nondegenerate parametric device 102 can be implemented using coplanar stripline resonators, microstrip resonators (as shown in FIG. 1), compact/lumped-element resonators, impedance matching networks, lumped-element capacitors and inductors, and three-dimensional cavities. Further, the dynamic range of the nondegenerate parametric device 102 (e.g., JPC) can be improved by enhancing the critical current of the Josephson junctions 106 that form the JRM 104 by, for example, using niobium junctions and nanobridges. The tunable bandwidth of nondegenerate parametric device 102 can be increased by shunting the Josephson junctions 106 of the JRM 104 with linear inductance, such as by using shunted Josephson junctions 108 in the ring. Also, the instantaneous bandwidth of the nondegenerate parametric device 102 can be enhanced by coupling the JRM 104 to external feedlines through properly designed impedance matching networks. This will enable the device to work at fast time scales and support rapid and sharp pulses.

It should be noted that although the magnetic source 182 shown in FIG. 1 is schematically drawn as a superconducting magnetic coil, the magnetic source 182 can be realized as an on-chip flux line and/or flux-line realized on a flip chip in close proximity to the JRM, which are driven by DC and AC currents. Additionally, it is noted that there should be a relatively strong mutual inductance between the magnetic source 182 and the JRM 104.

The microwave resonators 110 and 112, transmission lines 116, transmission lines 124, Josephson junctions 106 and 108, JRM 104, and flux line 120 include superconducting materials. Superconducting materials exhibit superconductivity below a critical temperature.

Figure 2:
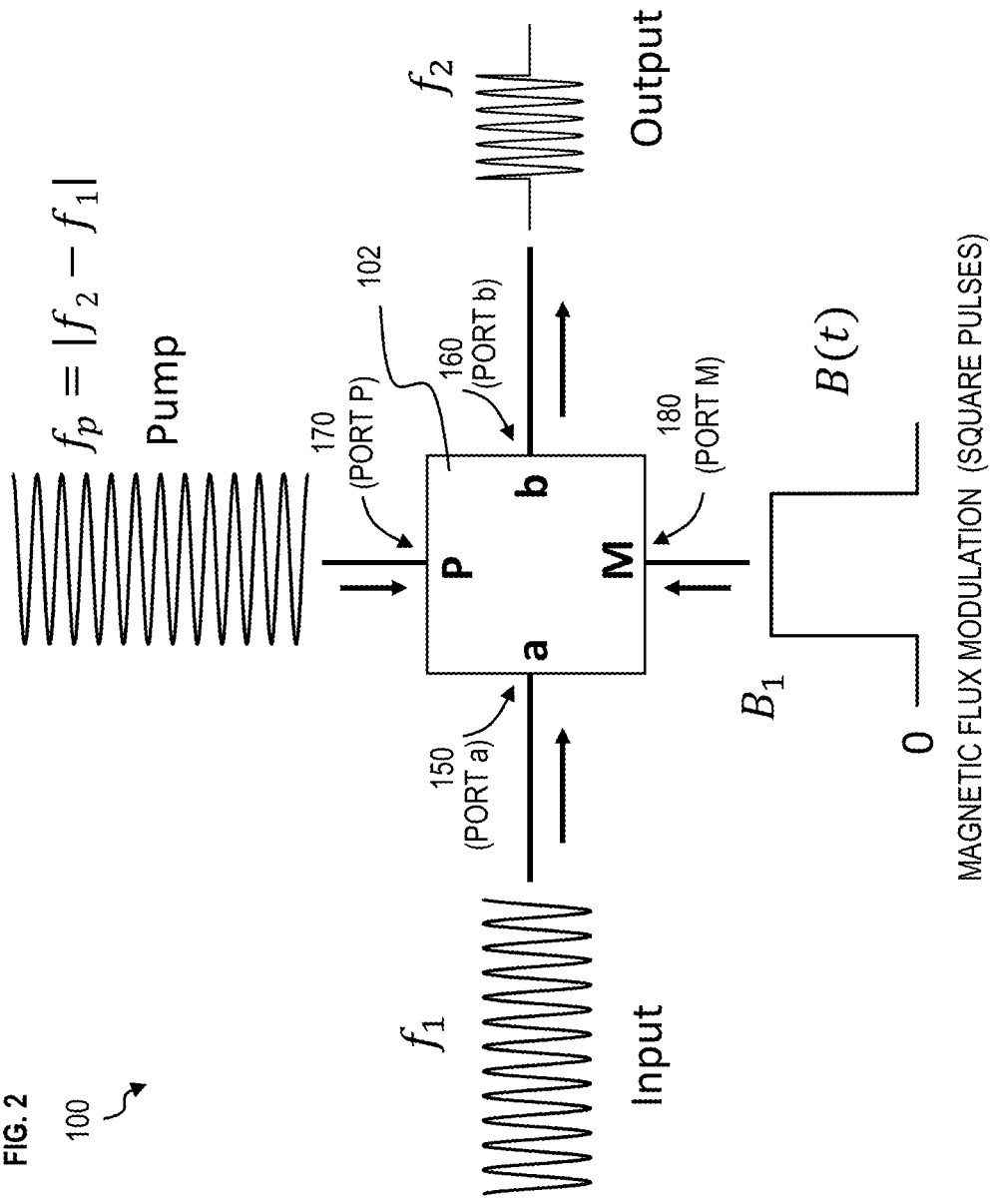
FIG. 2 depicts a block diagram of a circuit according to one or more embodiments of the invention.
Figure 3:
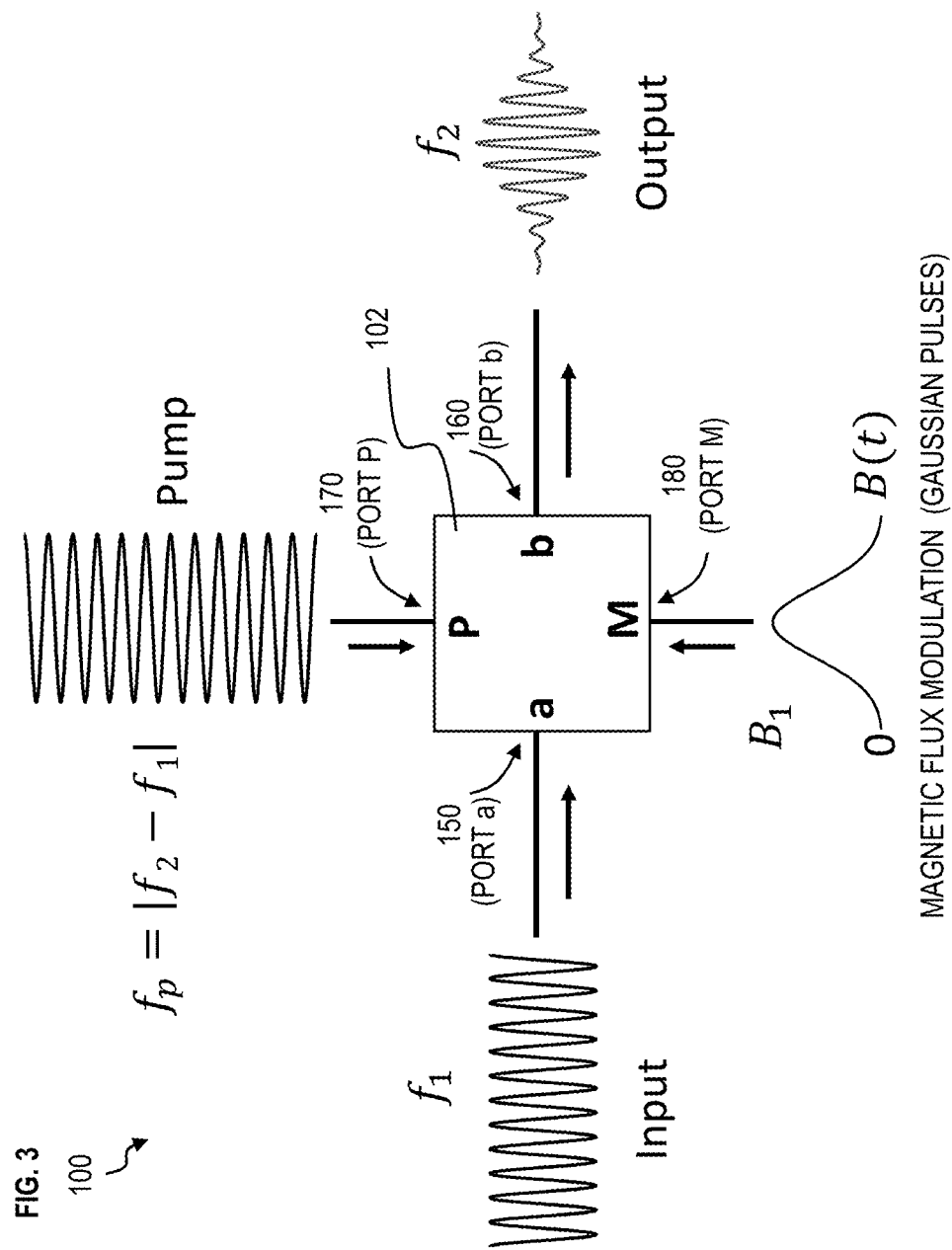
FIG. 3 depicts a block diagram of a circuit according to one or more embodiments of the invention.

FIG. 2 depicts an example of pulse shaping with frequency conversion by circuit 100 according to one or more embodiments of the invention. The nondegenerate parametric device 102 can be a lossless JPC operated in full frequency conversion mode with harmonics suppressed. FIG. 2 and FIG. 3 (discussed below) incorporate details of FIG. 1, although the details are omitted for the sake of conciseness and so as not to obscure FIGS. 2 and 3.

In FIG. 2, the nondegenerate parametric device 102 receives a continuous wave/signal having frequency $f_1$ at port 150 (e.g., port a) and a continuous wave/signal having frequency $f_p$ at port 170 (port P). The nondegenerate parametric device 102 receives a time-varying magnetic flux or pulsed magnetic flux at port 180 (e.g., port M). In this example, the time-varying magnetic flux is illustrated as square pulses repeated with a magnitude from, for example, 0 to $B_1$. The value 0 is illustrated for explanation purposes, and the magnitude can vary between any values including between $B_1$ and a non-zero value. The nondegenerate parametric device 102 is configured to generate an output signal having frequency $f_2$ and having its pulse or waveform shaped based on the time-varying magnetic flux input at port 180. With respect to the input signal at frequency $f_1$ and the output signal at frequency $f_2$, the pump signal (frequency $f_p$) is applied to satisfy $f_p=|f_2-f_1|$. Unlike diode-based mixers, the working point of nondegenerate parametric device 102 (e.g., JPC) depends on the applied magnetic flux bias from the magnetic source 182. By varying the applied magnetic flux as a function of time, the nondegenerate parametric device 102 is configured to modulate the transmitted microwave signals through the nondegenerate parametric device 102, thereby resulting in a modulated pulse shape or waveform shape for the output signal which is at frequency $f_2$ because of frequency conversion.

The magnetic source 182 can be controlled by and coupled to a controller (not shown) to generate the time-varying magnetic flux for port 180. An example controller can include or be coupled to control a current source configured to provide time-varying current, such as, for example DC and AC current. The controller can include a processor configured to read/execute computer-executable instructions in memory, and based on execution of the instructions, the controller is configured to cause the current source to vary electrical current provided to the magnetic source 182, which in turns generates time-varying magnetic flux (e.g., pulsed magnetic flux) according to one or more embodiments of the invention.

In this example, FIG. 2 illustrates square waves as the time-varying magnetic flux. It is contemplated that different types of time-varying magnetic flux can be utilized to pulse shape the corresponding output signals (frequency $f_2$). Examples of the types of time-varying magnetic flux can include rectangular pulses (e.g., depicted in FIG. 2), sinc pulses, gaussian pulses (e.g., depicted in FIG. 3), raised-cosine (cosine squared) pulses, etc.

FIG. 3 depicts pulse shaping with frequency conversion by circuit 100 according to one or more embodiments of the invention. In FIG. 3, the nondegenerate parametric device 102 can be a lossless JPC operated in full frequency conversion mode with harmonics suppressed. The nondegenerate parametric device 102 receives a continuous wave/signal having frequency $f_1$ at port 150 (e.g., port a) and a continuous wave/signal having frequency $f_p$ at port 170 (port P). As discussed herein, the nondegenerate parametric device 102 receives time-varying magnetic flux or pulsed magnetic flux at port 180 (e.g., port M). In this example, the time-varying magnetic flux is illustrated as gaussian pulses with magnitude that varies for 0 to $B_1$. The nondegenerate parametric device 102 is configured to generate an output signal having frequency $f_2$ and having its pulse or waveform shaped based on the time-varying magnetic flux input at port 180, as illustrated in FIG. 3. It is noted that the gaussian shape of the magnetic flux modulation shown in FIG. 3 is an exemplary simplification of the actual pulse shape that is required to generate a gaussian pulse of the microwave signal at the output. The actual required shape can be mathematically calculated using the device temporal response (versus time) as a function of applied magnetic flux. Again, regarding the input signal at frequency $f_1$ and the output signal at frequency $f_2$, the pump signal (frequency $f_p$) is applied to satisfy the relation $f_p=|f_2-f_1|=|f_b-f_a|$.

As discussed above, the nondegenerate parametric device 102 in FIGS. 2 and 3 uses frequency conversion to convert the input frequency $f_1$ of the input signal at port 150 to output frequency $f_2$ of output signal at port 160, in addition to shaping the pulse of output signal. This example is illustrated with an up conversion, although down conversion can be performed as well.

There are various technical benefits of performing pulse shaping or waveform shaping of microwave signal by a superconducting circuit (e.g., circuit 100 and circuit 400 discussed below) in the cooling system, which is close proximity to the one or more quantum processors receiving pulse shaped microwave signals in the cooling system. Generating microwave signals/pulses (which can be qubit readout and qubit control signals) using room-temperature electronics and transmitting them through microwave lines to a superconducting quantum processor located in dilution fridge has several issues, which can be avoided and/or mitigated by one or more embodiments of the invention although not required. An example issue that may be avoided and/or mitigated by one or more embodiments of the invention includes the following. Due to various impedance mismatches and dispersion relations (i.e., frequency dependencies) in the input lines of dilution refrigerators which typically contain coaxial cables, microwave connectors, filters, attenuators, microwave components, the transmitted microwave pulses undergo distortions in its path to the quantum processor. These distortions can cause readout, single-qubit errors, and two-qubit gate errors, which can be avoided and/or mitigated by one or more embodiments of the invention, although not required, because the pulse shaping occurs inside the cooling system. Further, it is noted that these distortions can be difficult to measure and characterize when the dilution refrigerator is at room temperature because the response of these microwave components tends to change when cooled down.

Another example issue that may be avoided and/or mitigated by one or more embodiments of the invention includes the following. Diode-based mixers that are used to generate microwave pulses at room temperature tend to produce parasitic harmonics and sidebands which can cause readout and gate errors for a quantum processor, if not suppressed or filtered out at the cost of adding overhead to the setup. However, these and other issues can be avoided and/or mitigated by one or more embodiments of the invention, although not required. An additional example issue that may be avoided and/or mitigated by one or more embodiments of the invention includes the following. To shield readout resonators of a quantum processor from elevated thermal photon population due to noise travelling through the readout input lines (which could lead to qubit dephasing), heavy filtering and attenuation are incorporated in these lines to attenuate thermal noise at these relatively high frequencies (e.g., 7 gigahertz (GHz) or above) of the readout resonators. This also adds hardware overhead to the setup. However, these and other issues can be avoided and/or mitigated by one or more embodiments of the invention, although not required, because the high frequencies are generated internally within the cooling system rather than externally at room temperature.

Figure 4:
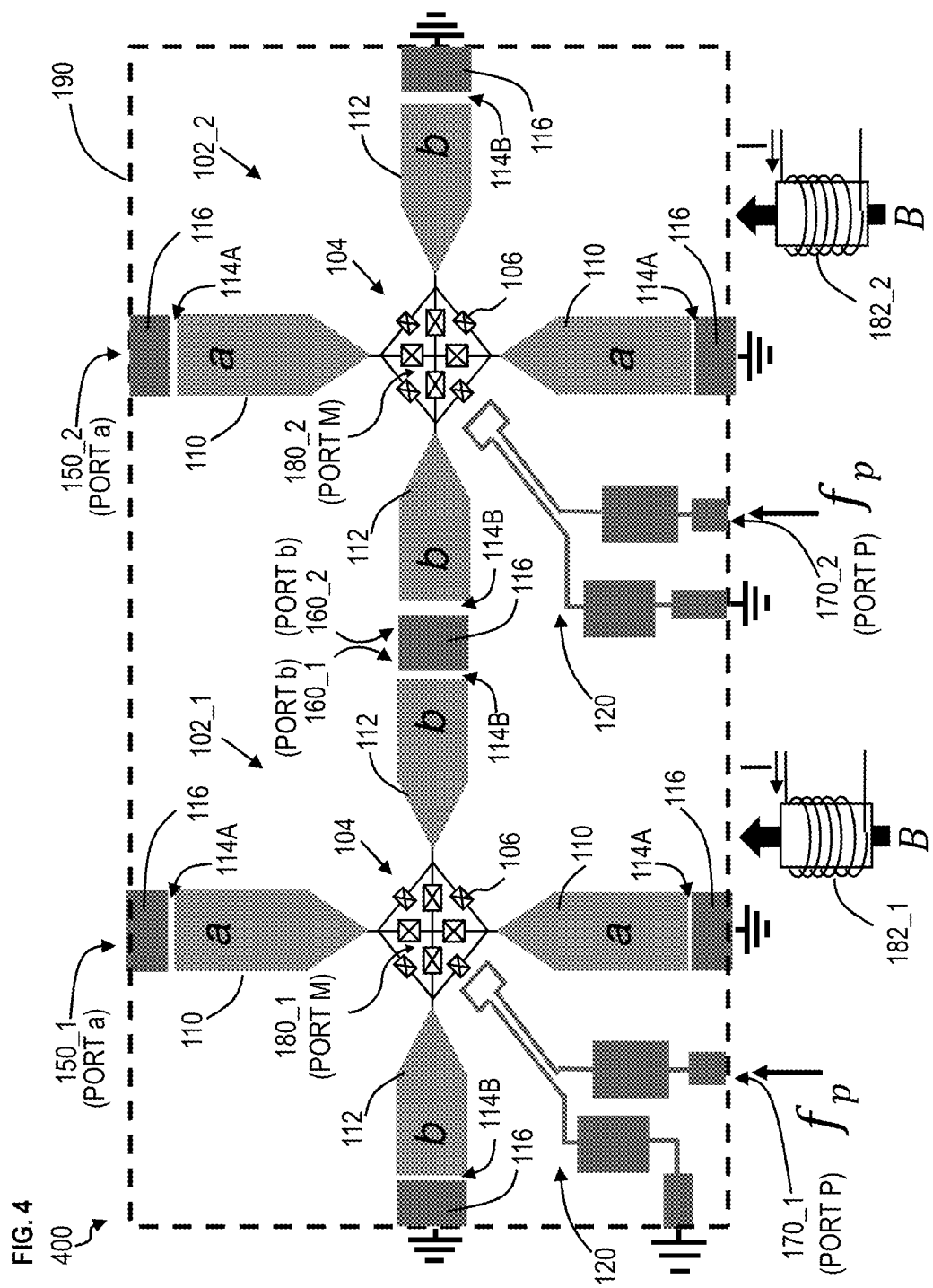
FIG. 4 depicts a schematic of a circuit according to one or more embodiments of the invention.

FIG. 4 depicts a schematic of a circuit 400 coupling nondegenerate parametric devices according to one or more embodiments of the invention. In FIG. 4 (along with FIGS. 5 and 6), the nondegenerate parametric devices include the details of nondegenerate parametric device 102 in FIG. 1, and the two nondegenerate parametric devices are designated as nondegenerate parametric devices 102_1 and 102_2 although their structure is nominally identical. Some details of the nondegenerate parametric device 102 in FIG. 1 are not described in FIGS. 4, 5, and 6 for the sake of conciseness but apply by analogy.

In FIG. 4, the nondegenerate parametric devices 102_1 and 102_2 respectively include their own JRM 104 that is incorporated into two microwave resonators 110 (e.g., resonator a) and 112 (e.g., resonator b) at an rf-current anti-node of their fundamental eigenmodes. As discussed above, each JRM 104 includes Josephson tunnel junctions 106. In nondegenerate parametric device 102_1 of circuit 400, one end of resonator 110 (e.g., resonator a) couples to port 150_1 (e.g., port a) via a coupling capacitor 114A and transmission line 116, while the other end of resonator 110 couples to ground via coupling capacitor 114A and transmission 116. In nondegenerate parametric device 102_1, one end of resonator 112 (e.g., resonator b) couples to port 160_1 (e.g., port b) via coupling capacitor 114B and transmission line 116, while the other end of resonator 112 couples to ground via coupling capacitor 114B and transmission line 116. The nondegenerate parametric device 102_1 is coupled to pump port 170_1 via flux line 120.

Analogously, in nondegenerate parametric device 102_2 of circuit 400 in FIG. 4, one end of resonator 110 (e.g., resonator a) couples to port 150_2 (e.g., port a) via a coupling capacitor 114A and transmission line 116, while the other end of resonator 110 couples to ground via coupling capacitor 114A and transmission 116. In nondegenerate parametric device 102_2, one end of resonator 112 (e.g., resonator b) couples to port 160_2 (e.g., port b) via coupling capacitor 114B and transmission line 116, while the other end of resonator 112 couples to ground via coupling capacitor 114B and transmission line 116. The nondegenerate parametric device 102_2 is coupled to pump port 170_2 via flux line 120. Ports 160_1 and 160_2 (ports b) are shared by both nondegenerate parametric devices 102_1 and 102_2 (e.g., the JPCs are back-to-back).

Analogous to FIG. 1, nondegenerate parametric devices 102_1 and 102_2 in circuit 400 of FIG. 4 separately receive magnetic flux ($\Phi_{ext}$) through their respective JRMs 104 via respective ports 180_1 and 180_2 (ports M). FIG. 4 shows magnetic source 182_1 providing external flux bias to the JRM 104 via port 180_1 in nondegenerate parametric device 102_1 by generating a magnetic field (e.g., B field or magnetic flux density) based on current (I). Similarly, FIG. 4 shows magnetic source 182_2 providing external flux bias to the JRM 104 in nondegenerate parametric device 102_2 via port 180_2. FIG. 4 depicts circuit 400 on chip 190.

Although FIG. 4 depicts a microstrip implementation of the nondegenerate parametric devices 102_1 and 102_2, the nondegenerate parametric devices 102_1 and 102_2 are not meant to be limited and other implementations are possible as discussed herein.

Figure 5:
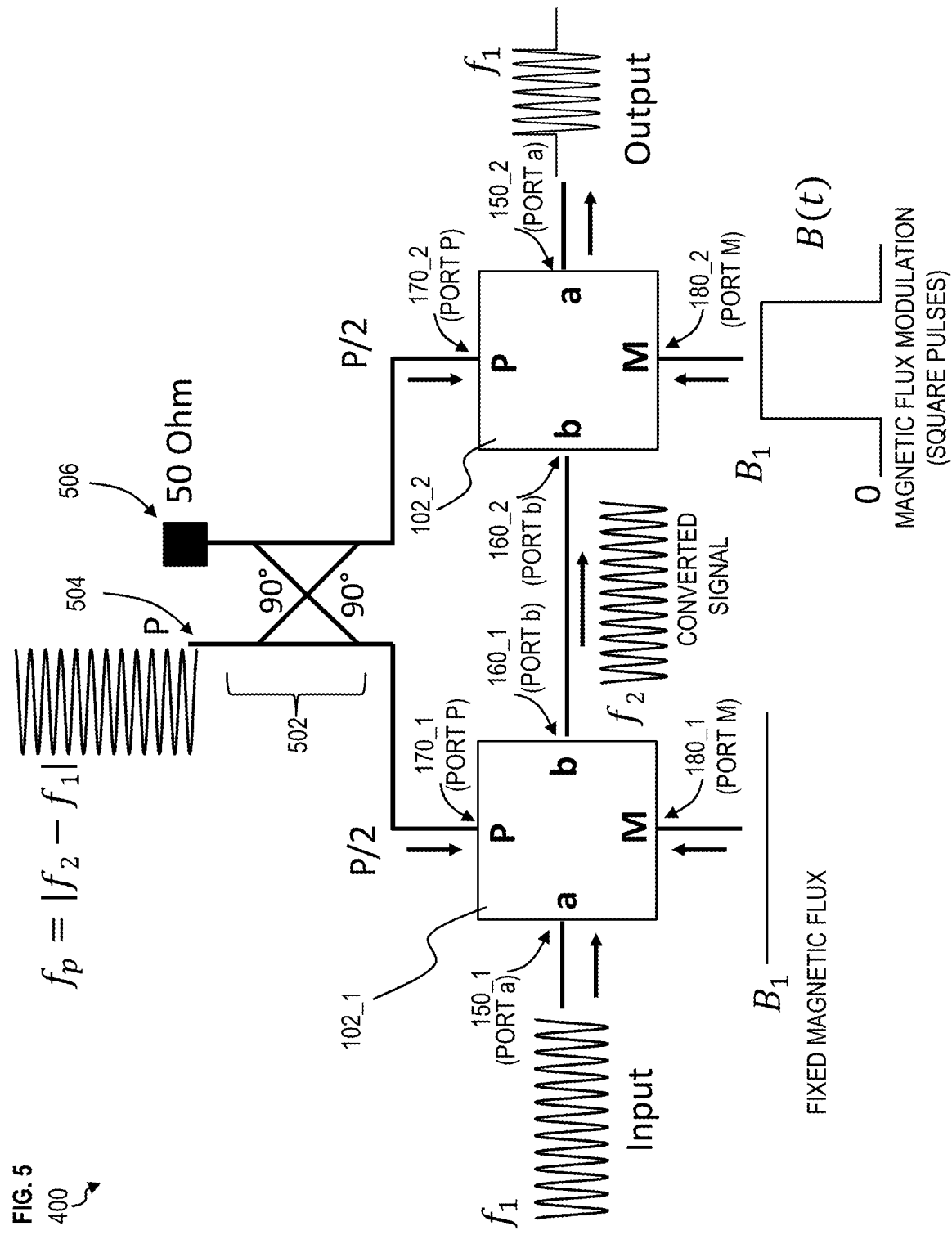
FIG. 5 depicts a block diagram according to one or more embodiments of the invention.

Turning to an example configuration of circuit 400, FIG. 5 illustrates pulse shaping without frequency conversion (when comparing the frequency of the input and output signals) according to one or more embodiments of the invention. The nondegenerate parametric device 102_1 receives a continuous wave/signal having frequency $f_1$ at port 150_1 (e.g., input port a in circuit 400) and a continuous wave/signal having frequency $f_p$ at port 170_1 (port P). The nondegenerate parametric device 102_2 receives the continuous wave/signal having frequency $f_p$ at port 170_2 (port P). A hybrid coupler 502 is connected to the circuit 400 via pump ports 170_1 and 170_2. The opposite end of the hybrid coupler 502 is connected to port 504 which receives the pump signal before distributing the pump signal to pump ports 170_1 and 170_2 and is connected to port 506. Port 506 can be coupled to a cold termination, for example, a standard 50 Ohm (Ω) termination. The hybrid coupler 502 is illustrated as a 90° (degree) hybrid coupler, and it should be appreciated that other types of couplers can be utilized. Ports 170_1 and 170_2 each receive one-half of the magnitude of the pump signal because of hybrid coupler 502. In one or more embodiments of the invention, the hybrid coupler 502 can be omitted and the pump ports 170_1 and 170_2 can separately receive their pump signals.

Returning to the example in FIG. 5, the nondegenerate parametric device 102_1 receives fixed magnetic flux at port 180_1 (e.g., port M). The fixed magnetic flux does not vary over time and therefore its magnitude ($B_1$) remains unchanged. Although the magnitude of the fixed magnetic flux is intended to remain constant and/or nearly constant over time, it should be appreciated that the magnitude is constant within the tolerances of the equipment generating the magnetic flux and variations because of error are acceptable. However, nondegenerate parametric device 102_2 receives a time-varying magnetic flux or pulsed magnetic flux at port 180_2 (e.g., port M) in which the magnitude changes over time from, for example, 0 to $B_1$. In this example, the time-varying magnetic flux is illustrated as square pulses.

The nondegenerate parametric device 102_1 outputs a frequency converted signal at port 160_1 (port b) to port 160_2 of nondegenerate parametric device 102_2. As noted herein, ports 160_1 and 160_2 are shared ports of nondegenerate parametric devices 102_1 and 102_2 in FIG. 5. The frequency converted signal can be an up conversion and/or down conversion of the input signal ($f_1$) received at port 150_1 of nondegenerate parametric device 102_1. In this example, the frequency of the input signal is up converted to a signal at frequency $f_2$ and transmitted to nondegenerate parametric device 102_2. This converted signal at frequency $f_2$ is an intermediate signal.

In response to receiving the frequency converted signal at port 160_2, the nondegenerate parametric device 102_2 is configured to generate an output signal having frequency $f_1$ and having its pulse or waveform shaped based on the time-varying magnetic flux input at port 180_2 (port M). With respect to the input signal at frequency $f_1$ and the output signal at frequency $f_1$, the pump signal (frequency $f_p$) is applied to satisfy the relation $f_p = |f_2 - f_1|$, assuming the frequency converted signal has frequency $f_2$. As noted herein, the working point of nondegenerate parametric devices 102_1 and 102_2 (e.g., JPCs) depends on the applied magnetic flux bias. By maintaining a fixed magnetic flux for nondegenerate parametric device 102_1 and varying the applied magnetic flux as a function of time for nondegenerate parametric device 102_2, the nondegenerate parametric devices 102_1 and 102_2 are configured to modulate the transmitted input microwave signal through the nondegenerate parametric devices 102_1 and 102_2, thereby resulting in a modulated pulse shape or waveform shape for output signal at frequency $f_1$.

The magnetic source 182_1 and 182_2 can be controlled to generate the fixed magnetic flux for port 180_1 and the time-varying magnetic flux for port 180_2, respectively, using one or more controllers coupled to one or more current sources. In one or more embodiments of the invention, each magnetic source 182_1 and 182_2 can be coupled to its own controller and/or current source. Additionally, a controller can control a current source that has multiple outputs for independently providing electrical current to magnetic source 182_1 and magnetic source 182_2. FIG. 5 illustrates square waves as the time-varying magnetic flux. As noted herein, different types of time-varying magnetic flux can be utilized to pulse shape the corresponding output signals while maintaining the frequency $f_1$. Examples types for the time-varying magnetic flux can include rectangular pulses (e.g., depicted in FIG. 5), sinc pulses, gaussian pulses (e.g., depicted in FIG. 6), raised-cosine (cosine squared) pulses, etc.

Figure 6:
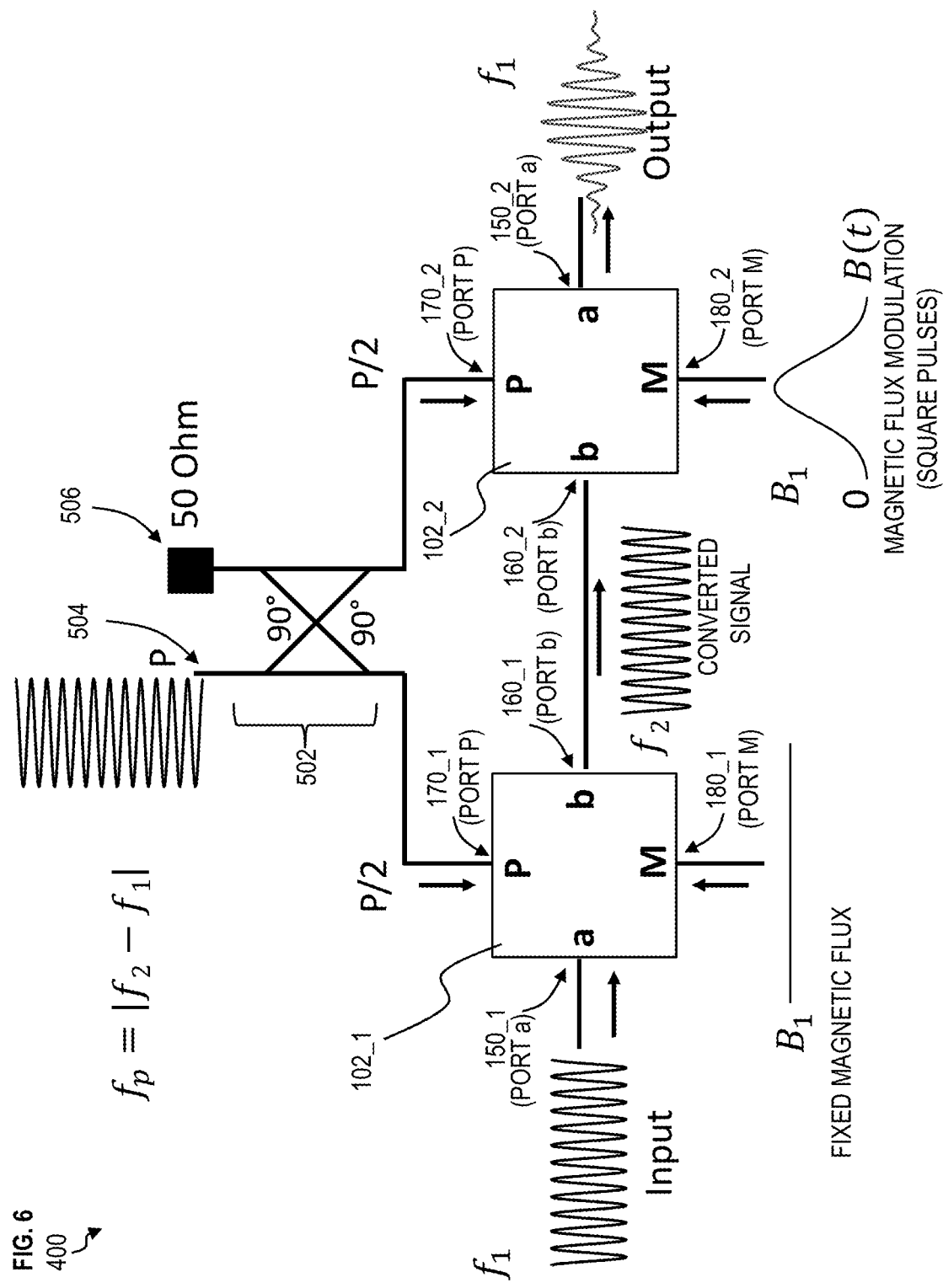
FIG. 6 depicts a block diagram according to one or more embodiments of the invention.

FIG. 6 depicts pulse shaping with frequency conservation by circuit 400 according to one or more embodiments of the invention. In FIG. 6, the nondegenerate parametric devices 102_1 and 102_2 are analogous to FIG. 5 and discussion of some details may be omitted. The nondegenerate parametric device 102_1 receives a continuous wave/signal having frequency $f_1$ at port 150_1 (e.g., input port a in circuit 400) and a continuous wave/signal having frequency $f_p$ at port 170_1 (port P). The nondegenerate parametric device 102_2 receives the continuous wave/signal having frequency $f_p$ at port 170_2 (e.g., port P).

As noted herein, the nondegenerate parametric device 102_1 receives fixed magnetic flux at port 180_1 (e.g., port M), which does not vary over time and therefore its magnitude ($B_1$) remains unchanged. The nondegenerate parametric device 102_2 receives a time-varying magnetic flux or pulsed magnetic flux at port 180_2 (e.g., port M) in which the magnitude changes over time from, for example, 0 to $B_1$. In this example, the time-varying magnetic flux is illustrated as gaussian pulses.

The nondegenerate parametric device 102_1 outputs a frequency converted signal at port 160_1 (port b) to port 160_2 of nondegenerate parametric device 102_2. The frequency converted signal can be an up conversion and/or down conversion of the input signal ($f_1$) received at port 150_1 of nondegenerate parametric device 102_1. For example, the input signal at frequency $f_1$ can be up converted to frequency $f_2$ and transmitted as frequency converted signal to nondegenerate parametric device 102_2. In response to receiving the frequency converted signal at port 160_2, the nondegenerate parametric device 102_2 is configured to generate an output signal having frequency $f_1$ and having its pulse or waveform shaped based on the time-varying magnetic flux input at port 180_2 (port M). With respect to the input signal at frequency $f_1$ and the output signal at frequency $f_1$, the pump signal (frequency $f_p$) is applied to satisfy the relation $f_p = |f_2 - f_1|$, assuming the frequency converted signal is frequency $f_2$. By maintaining fixed magnetic flux for nondegenerate parametric device 102_1 and varying the applied magnetic flux as a function of time for nondegenerate parametric device 102_2, the nondegenerate parametric devices 102_1 and 102_2 are configured to modulate the transmitted input microwave signal through the nondegenerate parametric devices 102_1 and 102_2, thereby resulting in a modulated pulse shape or waveform shape for output signal at frequency $f_1$.

FIGS. 5 and 6 depict examples in which the nondegenerate parametric device 102_1 receives a fixed magnetic flux at port 180_1 and nondegenerate parametric device 102_2 receives a time-varying magnetic flux at port 180_2, and it should be appreciated that other architectures are possible. According to one or more embodiments of the invention, the phase and/or amplitude of the output signal (e.g., a frequency $f_1$) in circuit 400 can be modulated at the frequency of the time-varying magnetic flux. In this example, the nondegenerate parametric device 102_1 receives time-varying magnetic flux at port 180_1 and the nondegenerate parametric device 102_2 receives the fixed magnetic flux at port 180_2, which means the external bias respectively applied to ports 180_1 and 180_2 is reversed. Accordingly, the output signal transmitted at port 150_2 of nondegenerate parametric device 102_2 can have its phase and/or amplitude modulated according to the frequency of the time-varying magnetic flux received by nondegenerate parametric device 102_1 at port 180_1. The circuit 400 can be coupled to a receiver (not shown), and the transmitted output signal is transmitted from circuit 400 to the receiver, thereby allowing the circuit 400 to be utilized for microwave communications.

Figure 7:
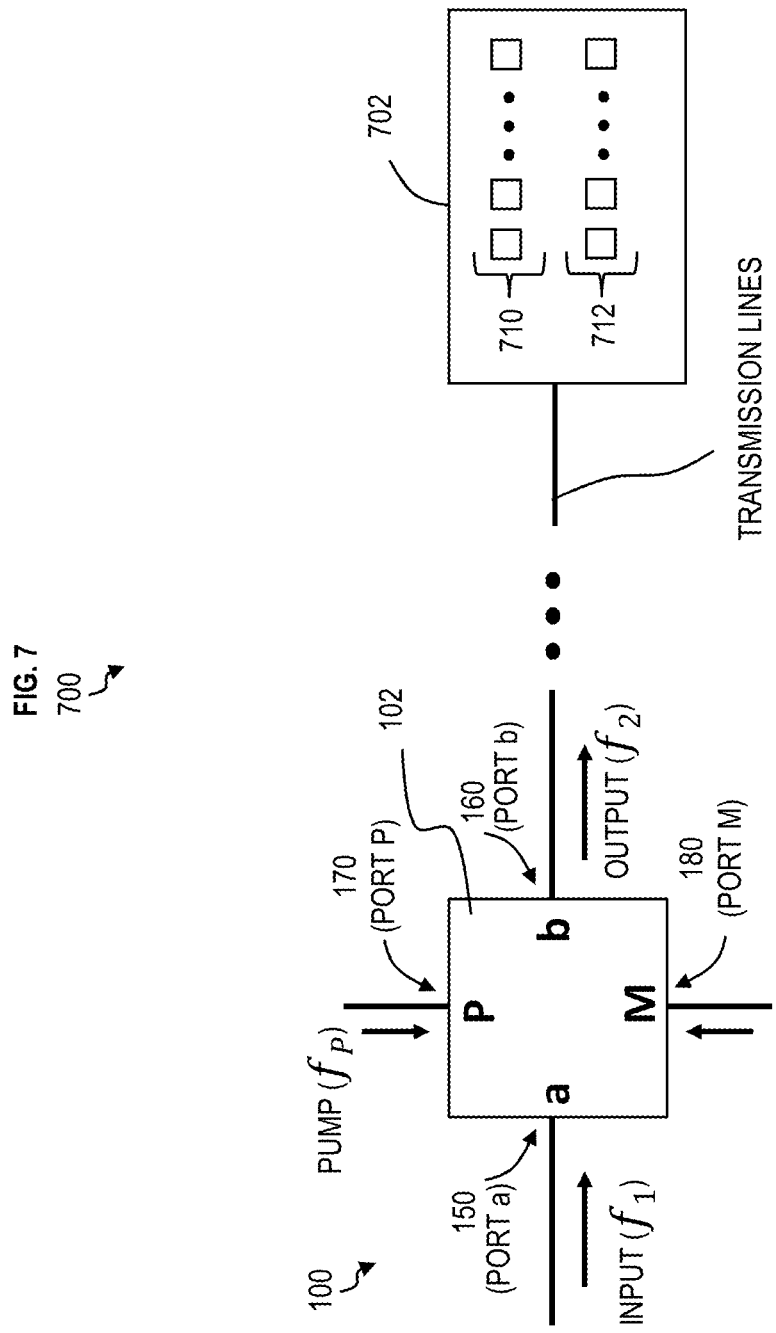
FIG. 7 depicts a block diagram of a system according to one or more embodiments of the invention.

FIG. 7 depicts a system 700 utilizing the circuit 100 to generate and pulse shape quantum signals (e.g., readout signals and/or qubit signals) in situ (e.g., in a cooling system) in accordance with one or more embodiments of the invention. The system 700 includes the circuit 100 coupled to a quantum processor 702 in a cooling system, such as for example, a dilution refrigerator. The quantum processor 702 can include a plurality of superconducting qubits, readout resonators, quantum memories, and quantum coupling devices. The quantum processor 702 includes qubits 710 coupled to readout resonators 712. A resonator is a physical assembly having a plurality of energy levels that can be used to store all or a portion of a quantum bit of information. For example, a resonator can be implemented as a transmission line, a resonant cavity, or any other structure appropriate for a given application. In general, a resonator will have a characteristic frequency that is constant, although it will be appreciated that a tunable resonator assembly can be used where required by a given application. A qubit is a physical assembly having a plurality of energy states whose population can be controlled. The qubit can be implemented, for example, as an anharmonic oscillator that can transfer energy between some combination of an electric field of a capacitor, a magnetic field of an inductor, and a superconducting phase difference. Example implementations of a qubit can include one or more of Josephson junctions, linear inductor, superconducting loop, gap capacitance, plate capacitance, and it can be realized, for example, as a Cooper pair box qubit, transmon qubit, fluxonium qubit, and flux qubit.

In FIG. 7, one or more readout resonators 712 is configured to infer or read out the state of one or more qubit 710. The readout resonators 712 are configured to receive readout signals/pulses which cause the readout resonators 712 to encode their state information that corresponds to the state of one or more qubits 710 into the output readout signals exiting quantum processor 702. The circuit 100 is configured to generate and pulse shape readout signals which are the output signals from port 160 (e.g., port b) of nondegenerate parametric device 102.

Using the output signals from port 160 of nondegenerate parametric device 102 as the readout signals/pulses for the quantum processor 702 provides various benefits for system 700. Because the readout pulses at frequency $f_2$ are generated by feeding the nondegenerate parametric device 102 (e.g., JPC) with continuous waves at $f_1$ and $f_p$ and by time-varying magnetic flux (e.g., using DC and/or AC current), the resultant pulses (i.e., output signals) are close in distance (e.g., in the same cooling system) to the quantum processor 702 and thereby avoid (or undergo less) distortions and unwanted harmonics associated readout pulses generated using room-temperature electronics (which are external to the cooling system). Particularly, the system 700 avoids distortions and unwanted harmonics associated readout pulses generated using room-temperature electronics and transmitted down through the dilution fridge input lines that contain multiple attenuators, filters, microwave cables, and connectors, all of which, due to various hard-to-avoid impedance mismatches and frequency dispersion, can potentially distort the readout pulses propagating down the lines at frequency $f_2$ prior to reaching the quantum processor. The room-temperature electronics connect to the cooling system by input lines which start at room temperature and end inside the cooling system. In FIG. 7, the transmission lines connecting the circuit 100 and quantum processor 702 are within the cooling system.

Further, relatively low-frequency microwave signals at frequencies $f_1$ and $f_p$, and time-varying magnetic flux are easier and cheaper to generate and control as compared to high-frequency microwave signals at frequency $f_2$ that would normally be generated at room temperature. Therefore, by having the circuit 100 generating output signals at frequency $f_2$ within the cooling system along with quantum processor 702, the system 700 reduces thermal photon population inside readout resonators 712 which cause qubit dephasing. Although one circuit 100 is shown coupled to the quantum processor 702 is FIG. 7, it should be appreciated that numerous circuits 100 can be coupled to the quantum processor 702.

Figure 8:
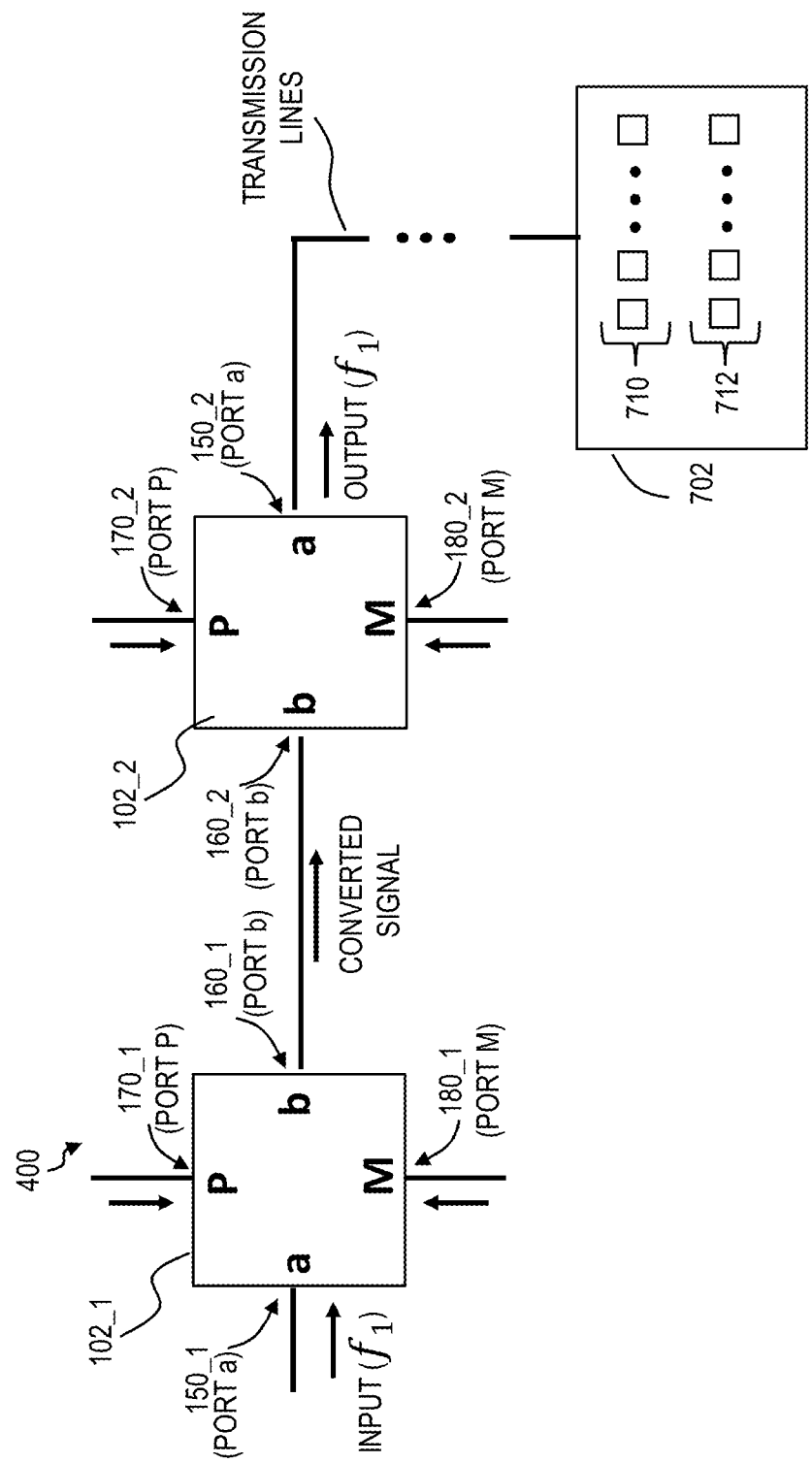
FIG. 8 depicts a block diagram of a system according to one or more embodiments of the invention.

FIG. 8 depicts a system 800 utilizing the circuit 400 to generate and pulse shape quantum signals (e.g., readout signals and/or qubit signals) in situ (e.g., in a cooling system) in accordance with one or more embodiments of the invention. The system 800 includes the circuit 400 coupled to quantum processor 702 in a cooling system, such as for example, a dilution refrigerator. As discussed herein, the quantum processor 702 includes qubits or qubit 710 coupled to readout resonators 712. The state of one or more qubit 710 can be affected or changed based on receiving qubit signals/pulses which can be a signal at or about the resonance frequency of the qubit 710. The circuit 400 is configured to generate and pulse shape qubit signals (and/or readout signals) which are the output signals from port 150_2 of nondegenerate parametric device 102_2.

Because the qubit signal/pulses at frequency $f_1$ (corresponding to, e.g., output signals) are generated by respectively feeding the two nondegenerate parametric device 102_1 and 102_2 (e.g., two JPCs) with continuous waves at frequency $f_1$ at port 150_1, with continuous waves at frequency $f_p$ at pump ports 170_1 and 170_2, with fixed magnetic flux at port 180_1, and with time-varying magnetic flux at port 180_2, the resultant pulses (i.e., output signals) are close in distance (e.g., in the same cooling system) to the quantum processor 702; as such, the output signals to quantum processor 702 avoid (or undergo less) distortions and unwanted harmonics associated with qubit pulses generated using room-temperature electronics that are external to the cooling system. Although one circuit 400 is shown coupled to the quantum processor 702 in FIG. 8, it should be appreciated that numerous circuits 400 can be coupled to the quantum processor 702.

As discussed herein, the system 800 avoids distortions and unwanted harmonics associated quit pulses generated using room-temperature electronics and transmitted down through the dilution fridge input lines that contain multiple attenuators, filters, microwave cables, and connectors, all of which can potentially distort the qubit pulses propagating down the lines at frequency $f_1$ prior to reaching the quantum processor, due to various hard-to-avoid impedance mismatches and frequency dispersion along long lines. As such, the system 800 is configured to provide better single-qubit fidelities and two-qubit gate fidelities in the quantum processor 702.

Figure 9:
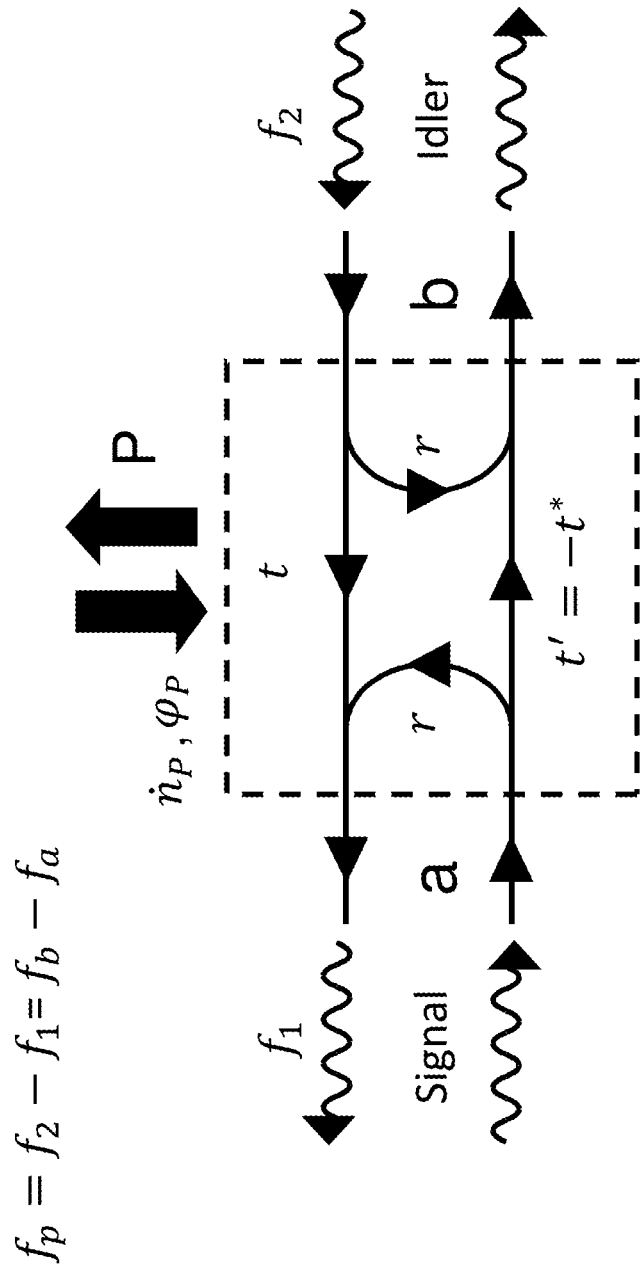
FIG. 9 depicts a signal flow graph for a nondegenerate three-wave mixing device in frequency conversion according to one or more embodiments of the inventions.

For the purposes of aiding the understanding of the reader and limitation, further details regarding nondegenerate parametric device 102 are discussed below in FIGS. 9, 10A, 10B, and 10C. FIG. 9 depicts a signal flow graph for a nondegenerate three-wave mixing device in frequency conversion according to one or more embodiments of the invention. The superconducting nondegenerate three-wave mixing device has three ports, which are generally designated as the Signal port (S) (e.g., port a), the Idler port (I) (e.g., port b), and the pump port (e.g., pump P). The superconducting nondegenerate three-wave mixing device has transmission t from Idler port to Signal port and transmission t' from Signal port to Idler port. From Idler to Signal port, the Idler microwave signal enters the Idler port at frequency $f_2$, is down converted, and exits the Signal port at frequency $f_1$. From Signal to Idler port, the Signal microwave signal enters the Signal port at frequency $f_1$, is up converted, and exits the Idler port at frequency $f_2$. The pump microwave signal provides the energy for frequency up conversion and frequency down conversion. The pump frequency is $f_p$, where $f_p = f_2 - f_1 = f_b - f_a$.

The superconducting nondegenerate three-wave mixing device, such as the JPC, satisfies the following scattering matrix on resonance when operated in noiseless frequency conversion:

$$[S] = \begin{pmatrix} r & t \\ -t* & r \end{pmatrix} = \begin{pmatrix} \cos\theta & ie^{i\varphi_P}\sin\theta \\ ie^{-i\varphi_P}\sin\theta & \cos\theta \end{pmatrix}$$

where $\varphi_p$ is the phase of the pump drive feeding the JPC, where $\dot{n}_p$ is the pump photon flux (i.e., the number of pump photons per unit time).

The full conversion working point is $|r|^2=0$, $|t|^2=1$ with no reflection and full transmission with frequency conversion. Since the scattering matrix is unitary, the following relation holds $|r|^2+|t|^2=1$. Unitary preserves the energy and the phase coherence of the transmitted signal. The JPC is a three-wave mixing device that includes three modes, which are differential mode X depicted in FIG. 10A, differential mode Y depicted in FIG. 10B, and a common mode Z depicted in FIG. 10C.

Figure 10A:
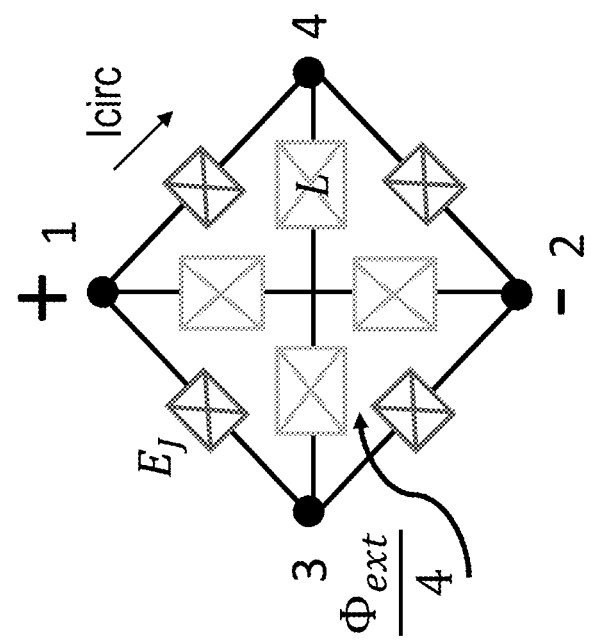
FIG. 10A depicts a nondegenerate three-wave mixing device in differential mode according to one or more embodiments of the invention.
Figure 10B:
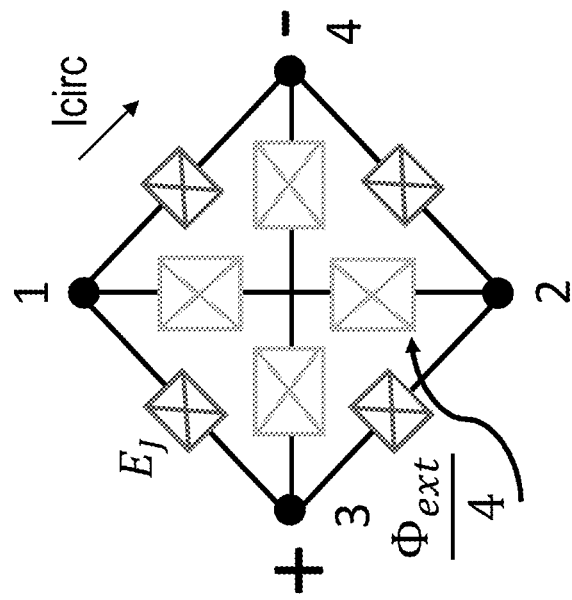
FIG. 10B depicts a nondegenerate three-wave mixing device in differential mode according to one or more embodiments of the invention.

FIGS. 10A, 10B, and 10C depict the rf-voltage excitation pattern for modes X, Y, Z of the JRM. The coupling constant $g_3$ between these three modes depends on the Josephson energy $E_J$ of the outer Josephson junctions of the JRM, the frequencies of the modes X, Y, Z, and the participation ratios of the three modes, which correspond to the ratio of the Josephson junction (JJ) inductance to the total inductance of the resonant mode structure and on the magnetic flux ($\Phi_{ext}$) threading the JRM loop. The Josephson energy of the JJ is denoted $E_J$. The linear inductor of the shunting JJs is denoted L.

In FIGS. 10A, 10B, and 10C, the sign of the coupling constant $g_3$ depends on the direction of the circulating current $I_{circ}$ (e.g., DC current) in the outer loop of the JRM, or alternatively on the external magnetic flux ($\Phi_{ext}$) threading the JRM loop. When a pump drive (e.g., a strong coherent microwave tone) is applied to the JPC, the coupling constant between modes a and b of the JPC is given by $g_{ab}=g_3\sqrt{n_p}e^{-\varphi_p}$, where $n_p$ is the average number of pump photons driving the JRM, and $\varphi_p$ is the phase of the pump drive.

Further discussion is provided regarding the energy of the inductively-shunted JRM. Assuming $\varphi_{X,Y,Z}^{mw} \ll 1$, the JRM energy is given by the following equation:

$$E_{JRM} = -E_J\sin\left(\frac{\varphi_{ext}}{4}\right)\varphi_X^{mw}\varphi_Y^{mw}\varphi_Z^{mw} + \left(E_J\cos\left(\frac{\varphi_{ext}}{4}\right) + \frac{E_L}{2}\right)\left(\frac{(\varphi_X^{mw})^2}{2} + \frac{(\varphi_Y^{mw})^2}{2}\right) + 2\left(E_J\cos\left(\frac{\varphi_{ext}}{4}\right) + \frac{E_L}{4}\right)(\varphi_Z^{mw})^2 - 4E_J\cos\left(\frac{\varphi_{ext}}{4}\right),$$

where $\varphi_{ext} = \frac{2\pi\Phi_{ext}}{\Phi_0}$, $\Phi_0$ is the flux quantum, and $$E_L = \left(\frac{\Phi_0}{2\pi}\right)^2 / L$$

is the inductive energy of the shunt inductor. Further, $\varphi_{X,Y,Z}^{mw}$ are the reduced generalized flux corresponding to the microwave excitation of modes X, Y, Z, respectively.

In the $E_{JRM}$ equation (JRM energy), the term $$-E_J\sin\left(\frac{\varphi_{ext}}{4}\right)\varphi_X^{mw}\varphi_Y^{mw}\varphi_Z^{mw}$$

is the primary term of the JRM energy, and it shows the three-wave mixing operation of the device between $\varphi_X^{mw}$, $\varphi_Y^{mw}$, $\varphi_Z^{mw}$. The term $$\left(E_J\cos\left(\frac{\varphi_{ext}}{4}\right) + \frac{E_L}{2}\right)\left(\frac{(\varphi_X^{mw})^2}{2} + \frac{(\varphi_Y^{mw})^2}{2}\right) + 2\left(E_J\cos\left(\frac{\varphi_{ext}}{4}\right) + \frac{E_L}{4}\right)(\varphi_Z^{mw})^2$$

in the $E_{JRM}$ equation renormalizes the frequencies of the modes X, Y, Z. The term $$4E_J\cos\left(\frac{\varphi_{ext}}{4}\right)$$

is independent of $\varphi_{X,Y,Z}^{mw}$. The $$E_J\sin\left(\frac{\varphi_{ext}}{4}\right)\varphi_X^{mw}\varphi_Y^{mw}\varphi_Z^{mw}$$

shows that the three-wave mixing operation is enabled by the external magnetic flux threading the JRM. For example, in a case for external magnetic flux $\varphi_{ext}=0$, this means there is no mixing between the three modes. Although it might seem that one should keep $\varphi_{ext}=$constant, where the constant is set to give certain frequencies for modes X and Y, one or more embodiments of the invention are configured so that $\varphi_{ext}(t)$ can be modulated in time which is used to pulse shape the output signals of modes X and Y as discussed herein.

FIG. 11 is a flow chart of a method 1100 for pulse shaping with frequency conversion according to one or more embodiments. The method 1100 includes receiving, by a mixing device (e.g., nondegenerate parametric device 102), signals and a time-varying magnetic flux (e.g., via port 180 (port M)), at block 1102. At block 1104, the mixing device (e.g., nondegenerate parametric device 102) is configured to use the signals and the time-varying magnetic flux to generate an output signal (e.g., via port 160) having a waveform profile set by the time-varying magnetic flux.

The signals include a first microwave signal (e.g., input signal at frequency $f_1$) and a second microwave signal (e.g., pump signal at frequency $f_p$), the first and second microwave signals being at a different frequency. The time-varying magnetic flux (e.g., via port 180) is a time-varying control signal having a magnitude that is modulated as a function of time. The microwave signals are continuous wave signals whose amplitude, frequency, and phase are fixed over time. The mixing device includes a ring modulator (e.g., Josephson ring modulator 104). The waveform profile of the output signal (e.g., output signal at frequency $f_2$ is generated, at least in part, based on a ring modulator of the mixing device responding to the time-varying magnetic flux.

FIG. 12 is a flow chart of a method 1200 for pulse shaping without frequency conversion (i.e., the frequencies of the output and input signals are equal (or substantially equal)) according to one or more embodiments. At block 1202, the method 1200 includes receiving, by a circuit (e.g., circuit 400), signals (e.g., via port and a time-varying magnetic flux, the circuit including a first mixing device (e.g., nondegenerate parametric device 102_1) coupled to a second mixing device (e.g., nondegenerate parametric device 102_2). At block 1204, the circuit (e.g., circuit 400) is configured to use the signals (e.g., via ports 150_1, 150_2, 170_1, 170_2) and the time-varying magnetic flux (via port 180_2) to generate an output signal having a waveform profile set by the time-varying magnetic flux.

The time-varying magnetic flux is a time-varying signal having a magnitude that is modulated as a function of time. One of the first mixing device and the second mixing device receives the time-varying magnetic flux and another one of the first mixing device and the second mixing device receives a fixed magnetic flux. The first mixing device (e.g., nondegenerate parametric device 102_1) is configured to use a first signal (e.g., input signal via port 150_1) and a second signal (e.g., pump signal via port 170_1) of the signals to provide an intermediate signal (e.g., converted signal via port 160_1) to the second mixing device (e.g., nondegenerate parametric device 102_2). The second mixing device is configured to receive an intermediate signal from the first mixing device, the second mixing device being configured to use the intermediate signal (e.g., converted signal) as input to generate the output signal (e.g., output signal via port 150_2).

FIG. 13 is a flow chart of a method 1300 of configuring a circuit 100 according to one or more embodiments. At block 1302, the method 1300 includes coupling a three-wave mixing device (e.g., nondegenerate parametric device 102) to a magnetic source (e.g., magnetic source 182), the three-wave mixing device being configured to receive a time-varying magnetic flux (e.g., via port 180) from the magnetic source. At block 1304, the method 1300 includes configuring the three-wave mixing device (e.g., nondegenerate parametric device 102) to generate an output signal (e.g., via port 160) having a waveform profile set by the time-varying magnetic flux.

The time-varying magnetic flux is a time-varying signal having a magnitude that is modulated as a function of time. The three-wave mixing device includes a ring modulator. The waveform profile of the output signal is generated, at least in part, based on a ring modulator of the three-wave mixing device being configured to respond to the time-varying magnetic flux. The three-wave mixing device includes resonators (e.g., resonator 110 (or resonator a) resonator 112 (or resonator b)) coupled to a ring modulator. The three-wave mixing device is configured to convert an input signal having an original waveform profile to the output signal having the waveform profile.

FIG. 14 is a flow chart of a method 1400 of configuring a circuit 400 according to one or more embodiments. At block 1402, the method 1400 includes coupling a first three-wave mixing device (e.g., nondegenerate parametric device 102_1) and a second three-wave mixing device (e.g., nondegenerate parametric device 102_2) in a circuit 400, the first three-wave mixing device being coupled to a first magnetic source (e.g., magnetic source 182_1) to receive a fixed magnetic flux, the second three-wave mixing device being coupled to a second magnetic source (e.g., magnetic source 182_2) to receive a time-varying magnetic flux. At block 1404, the method 1400 includes configuring the circuit 400 to generate an output signal (e.g., via port 150_2) having a waveform profile set by the time-varying magnetic flux.

The time-varying magnetic flux is a time-varying signal having a magnitude that is modulated as a function of time. The fixed magnetic flux include a magnitude that remains constant over time. The first three-wave mixing device is configured to use a first signal (e.g., input signal via port 150_1) and a second signal (e.g., pump signal via port 170_1) to provide an intermediate signal (e.g., converted signal via port 160_1) to the second three-wave mixing device. The second three-wave mixing device is configured to receive an intermediate signal (e.g., via port 160_2) from the first three-wave mixing device, the second three-wave mixing device being configured to use the intermediate signal as input to generate the output signal (e.g., via port 150_2).

According to one or more embodiments, a system includes a circuit 400 including a first part and a second part, and a first magnetic source 182_1 coupled to the first part and configured to provide a fixed magnetic flux to the first part. A second magnetic source 182_2 coupled to the second part and configured to provide a time-varying magnetic flux to the second part, wherein the circuit 400 is configured to generate an output signal having a waveform profile set by the time-varying magnetic flux.

The first part includes a first three-wave mixing device (e.g., nondegenerate parametric device 102_1) and the second part includes a second three-wave mixing device (e.g., nondegenerate parametric device 102_2). The first part includes a ring modulator (e.g., Josephson ring modulator 104) configured to interact with the fixed magnetic flux and the second part includes another ring modulator (e.g., Josephson ring modulator 104) configured to interact with the time-varying magnetic flux. The first part is configured to output an intermediate signal to the second part, and the second part is configured to use the intermediate signal as input to generate the output signal.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method comprising:
   mixing, by a mixing device, signals and a time-varying magnetic flux; and
   generating, by the mixing device, an output signal having a waveform profile set by the time-varying magnetic flux, the signals comprising a pump signal distinct from the time-varying magnetic flux, the pump signal comprising a frequency which is a difference in frequencies between the output signal and one of the signals.

2. The method of claim 1, wherein the mixing device is a nondegenerate mixing device.

3. The method of claim 1, wherein the mixing device is configured to mix the signals at a quantum limit.

4. The method of claim 1, wherein the signals comprise a first signal and a second signal at different microwave frequencies.

5. The method of claim 1, wherein the time-varying magnetic flux is a time-varying signal having a magnitude that is modulated as a function of time.

6. The method of claim 1, wherein the signals are continuous wave signals having an amplitude, a frequency, and a phase fixed versus time.

7. The method of claim 1, wherein the mixing device comprises a Josephson ring modulator.

8. The method of claim 1, wherein the waveform profile of the output signal is generated, at least in part, based on a Josephson ring modulator of the mixing device responding to the time-varying magnetic flux.

9. A method comprising:
   mixing, by a circuit, signals and a time-varying magnetic flux; and
   generating, by the circuit, an output signal having a waveform profile set by the time-varying magnetic flux, the circuit comprises mixing devices coupled together, wherein one of the mixing devices is configured to receive the time-varying magnetic flux and another one of the mixing devices is configured to receive a fixed magnetic flux.

10. The method of claim 9, wherein the mixing devices are nondegenerate mixing devices.

11. The method of claim 9, wherein the another one of the mixing devices is configured to use a first microwave signal and a second microwave signal of the signals to provide an intermediate microwave signal to the one of the mixing devices.

12. The method of claim 9, wherein the one of the mixing devices is configured to receive an intermediate signal from the another one of the mixing devices, the one of the mixing devices being configured to use the intermediate signal as input to generate the output signal.

13. The method of claim 9, wherein the mixing devices are configured to mix the signals at a quantum limit.

14. The method of claim 9, wherein the signals comprise a first signal and a second signal at different microwave frequencies.

15. The method of claim 9, wherein the time-varying magnetic flux is a time-varying signal having a magnitude that is modulated as a function of time.

* * * * *